United States Patent
Bu et al.

(10) Patent No.: US 10,515,892 B2
(45) Date of Patent: Dec. 24, 2019

(54) TSV INTERCONNECT STRUCTURE AND MANUFACTURING METHOD THEREOF

(71) Applicant: Semiconductor Manufacturing International (Shanghai) Corporation, Shanghai (CN)

(72) Inventors: Weihai Bu, Beijing (CN); Hanming Wu, Beijing (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 238 days.

(21) Appl. No.: 14/145,572

(22) Filed: Dec. 31, 2013

(65) Prior Publication Data
US 2014/0374916 A1 Dec. 25, 2014

(30) Foreign Application Priority Data

Jun. 21, 2013 (CN) .......................... 2013 1 0253184

(51) Int. Cl.
| | | |
|---|---|---|
| H01L 23/522 | (2006.01) | |
| H01L 21/768 | (2006.01) | |
| H01L 23/48 | (2006.01) | |

(52) U.S. Cl.
CPC .... *H01L 23/5226* (2013.01); *H01L 21/76877* (2013.01); *H01L 21/76898* (2013.01); *H01L 23/481* (2013.01); *H01L 21/7682* (2013.01); *H01L 2225/06544* (2013.01); *H01L 2924/0002* (2013.01)

(58) Field of Classification Search
CPC ............. H01L 21/764; H01L 21/76877; H01L 21/76898; H01L 23/481; H01L 23/5226; H01L 21/7682; H01L 2225/06544; H01L 2924/0002; H01L 2924/00
See application file for complete search history.

(56) References Cited

U.S. PATENT DOCUMENTS

| | | | | |
|---|---|---|---|---|
| 7,122,478 | B2 * | 10/2006 | Han | ................. H01L 21/31144 438/710 |
| 8,736,018 | B2 * | 5/2014 | Kim | .................... H01L 21/7682 257/521 |
| 8,828,829 | B2 * | 9/2014 | Joung | ................... H01L 21/764 438/294 |
| 9,153,489 | B2 * | 10/2015 | Lee | ....................... H01L 23/481 |
| 2005/0145917 | A1 * | 7/2005 | Takeuchi | ................ H01L 28/91 257/306 |

(Continued)

FOREIGN PATENT DOCUMENTS

JP  2011-153370  * 10/2010

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

A method for forming a through-substrate-via structure includes forming a via hole in a substrate, depositing a conductive material in the via hole, forming an annular groove in the substrate surrounding the conductive material, and depositing a dielectric material in the annular groove with overhang portions of the deposited dielectric material at a top surface of the groove forming an air gap in an interior portion of the groove.

20 Claims, 6 Drawing Sheets

(56) References Cited

U.S. PATENT DOCUMENTS

| | | | |
|---|---|---|---|
| 2010/0078770 A1* | 4/2010 | Purushothaman | H01L 21/6835 257/621 |
| 2011/0233785 A1* | 9/2011 | Koester | H01L 21/768 257/773 |
| 2012/0013022 A1* | 1/2012 | Sabuncuoglu Tezcan et al. | 257/774 |
| 2012/0139127 A1* | 6/2012 | Beyne | 257/774 |
| 2013/0115769 A1* | 5/2013 | Yu | H01L 21/76898 438/667 |
| 2013/0127019 A1* | 5/2013 | Lee et al. | 257/621 |

* cited by examiner

TSV INTERCONNECT STRUCTURE AND MANUFACTURING METHOD THEREOF

CROSS-REFERENCES TO RELATED APPLICATIONS

This application claims priority to Chinese Patent Application No. 201310253184.8, filed Jun. 21, 2013, entitled "TSV INTERCONNECT STRUCTURE AND MANUFACTURING METHOD THEREOF," commonly assigned, incorporated by reference herein for all purposes.

BACKGROUND OF THE INVENTION

The present invention relates to semiconductor device structures. More particularly, embodiments of the present invention provides methods for forming through-silicon-via or through-substrate via (TSV) interconnect structures.

Since the advent of semiconductor technology, integration of various electronic components continues to improve. Enhanced integration has come mainly from the minimum feature size decreases, so that more components can be formed in a given area. However, this integration is two-dimensional, and a significant improvement in two-dimensional photolithography technology for manufacturing integrated circuits plays an important role. But there are problems of two-dimensional integrated circuit density limit.

To further increase the circuit density, three-dimensional vertical stacking techniques are used vertically stack multi-layer IC components to shorten the average line length to save space. Each edge portion of the plurality of lead pins of the chip may be needed, and according to the need to use pins, the chip will need to be interconnected using the connecting wires, or the use of these pins are connected through the chip to the circuit board. But in the three-dimensional interconnect stack, the connection between the chips are more complex, unwieldy, and can lead to circuit increasing the volume of circuit board.

For this reason, a TSV (through-silicon-via) techniques have been proposed for three-dimensional ICs. The through-silicon vias are formed through the silicon wafer to form vertical connections between different wafers.

BRIEF SUMMARY OF THE INVENTION

The inventors of this invention have observed that conventional through silicon via structures tend to suffer from high parasitic capacitance and complex processes. For example, Chinese Patent Application Nos. 2009101984581 and 2012101000048 disclose a semiconductor substrate having through-silicon-vias and relying on insulating dielectric material between the silicon vias and the substrate, resulting in semiconductor devices having large parasitic capacitance, and thus adversely affect the circuit characteristics of the device. Chinese Application No. 2009101435283 discloses an air gap between the silicon substrate and the through holes for insulation, but it involves complex processes and stringent material requirements. U.S. Patent Publication No. 20120013022 discloses a method of making a three-dimensional structure and its interconnection with an air gap. Although somewhat reduced, a large parasitic capacitance still exists between the conductive material and the insulating layer in the silicon vias. A conventional way to reduce parasitic capacitance is to use a material having a lower dielectric constant.

To overcome the above problems, embodiments of the present invention provide methods of making a silicon-via interconnect structure, including the steps of forming the through hole and the step of forming an insulating layer. The step of forming the insulating layer includes forming an annular groove or trench surrounding the conductive via. The annular groove of has an aspect ratio of 5:1 to 20:1. A dielectric material is formed by a plasma deposition method and deposited into the annular groove. The dielectric material seals the top portion of the groove and forms an air gap inside the groove. In some embodiments, the volume of the air gap is 50% to 90% of the total volume of the annular groove. The deposition condition is selected to enhance formation of overhang at the entrance of the groove. In some embodiments, a PECVD (plasma enhanced chemical vapor deposition) process is used to deposit the dielectric material, and the substrate is oriented in a direction such that the overhand formation is enhanced. In a PECVD deposition process, the ion density can be high enough that significant sputtering of the deposited film can be employed to help planarize the film and fill trenches or holes. In some embodiments, the sputtering yield is the highest when the angle between the incoming plasma and the normal or perpendicular direction of the surface of the groove is between 40° and 70°. Therefore, in embodiments of the invention, the substrate is tilted such that the high sputtering yield angles are avoided in order to enhance overhang formation. In some embodiment, the direction of the plasma sputtering and the normal direction of the surface of the plane of the annular groove forms an angle $\alpha$, with $0° < \alpha < 45°$ or $70° < \alpha < 90°$.

According to an embodiment of the present invention, a method for forming a through-substrate-via structure includes forming a via hole in a substrate, depositing a conductive material in the via hole, forming an annular groove in the substrate surrounding the conductive material in the via hole, and depositing a dielectric material in the annular groove with overhang portions of the deposited dielectric material at a top surface of the groove forming an air gap in an interior portion of the groove.

In an embodiment of the above method, forming the annular groove includes etching the annular groove in the substrate surrounding the conductive material such that the annular groove is spaced apart from the conductive material by a portion of the substrate.

In another embodiment of the above method, forming the annular groove includes etching the annular groove in the substrate surrounding the conductive material such that the annular groove exposes at least a portion of the conductive material.

In another embodiment of the above method, the method also includes, before depositing the conductive material, forming a dielectric liner layer lining the via hole, and forming a diffusion barrier layer over the dielectric liner layer in the via hole.

In another embodiment of the above method, forming the annular groove comprises removing the diffusion barrier layer to form the annular groove.

In another embodiment of the above method, depositing a dielectric material in the annular groove Includes using a plasma enhanced chemical vapor deposition process wherein the substrate is oriented at angle with respect to the plasma sputtering direction to reduce plasma sputtering yield.

In another embodiment of the above method, the substrate is oriented such that an angle $\alpha$ is formed between the plasma sputtering direction and the normal direction of the top surface of the groove and the angle is in the following range, 0°<α<20° or 45°<α<90°.

In another embodiment of the above method, the substrate is oriented such that an angle α is formed between the plasma sputtering direction and the normal direction of the top surface of the groove and the angle is in the following range, 0°<α<10° or 50°<α<90°.

In another embodiment of the above method, the volume of the air gap is about 50%~90% of the volume of the annular groove.

In another embodiment of the above method, the annular groove is characterized by a width to depth ratio of about 5:1~20:1.

According to another embodiment of the present invention, a method for forming a through-silicon-via (TSV) structure includes forming an annular groove in a substrate, depositing a dielectric material in the annular groove with overhang portions of the deposited dielectric material at a top surface of the groove to form an air gap in an interior portion of the groove, wherein depositing a dielectric material in the annular groove comprises using a plasma enhanced chemical vapor deposition process wherein the substrate is oriented at angle with respect to the plasma sputtering direction to reduce plasma sputtering yield. The method also includes forming a via hole inside the annular groove in the substrate and depositing a conductive material inside the via hole.

In an embodiment of the above method, the substrate is oriented such that an angle α is formed between the plasma sputtering direction and the normal direction of the top surface of the groove and the angle is in the following range, 0°<α<20° or 45°<α<90°.

In another embodiment of the above method, an angle α is formed between the plasma sputtering direction and the normal direction of the top surface of the groove and the angle is in the following range, 0°<α<10° or 50°<α<90°.

In another embodiment of the above method, the volume of the air gap is about 50%~90% of the volume of the annular groove.

In another embodiment of the above method, the annular groove is characterized by a width to depth ratio of about 5:1~20:1.

According to yet another embodiment of the present invention, a through-silicon-via (TSV) interconnect structure includes a substrate, a via hole extending through the substrate, the via hole including a conductive material deposited therein. The TSV structure also includes an annular groove surrounding the via hole and a dielectric material inside the annular groove forming an enclosed region having an air gap in the annular groove.

In an embodiment of the above structure, the volume of the air gap is about 50%~90% of the volume of the annular groove.

In another embodiment of the above structure, the conductive material in the via hole is separated from the annular groove by a diffusion barrier layer.

In another embodiment of the above structure, the conductive material in the via hole is in direct contact with the dielectric material inside the annular groove.

In another embodiment of the above structure, the conductive material in the via hole is in direct contact with the air gap inside the annular groove.

A further understanding of the nature and advantages of the present invention may be realized by reference to the remaining portions of the specification and the drawings

DETAILED DESCRIPTION OF THE INVENTION

The description below will make reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 1:
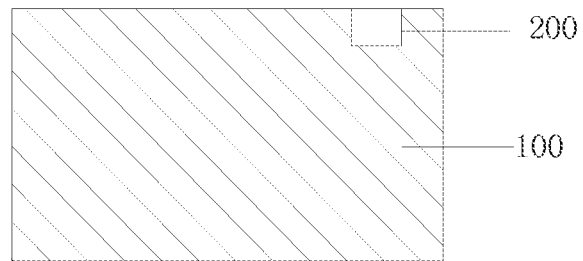
FIG. 1 is a cross-sectional view of a semiconductor substrate, which has undergone front-end processes with a semiconductor structure according to an embodiment of the present invention.

FIG. 1 is a cross-sectional view of a semiconductor substrate 100, which has undergone front-end processes with a semiconductor device structure 200 already formed in the substrate. Semiconductor device device structure 200 may include active device structures and/or passive device structures that can be fabricated in a conventional integrated circuit front-end process. The substrate material may be selected from doped or undoped silicon substrate. It is noted that even though embodiments of the invention are described using a silicon device substrate as an example, the methods and device structures disclosed herein are applicable to other substrates and devices, for example, a compound semiconductor substrate or a circuit board.

FIGS. 2-7 illustrate a method for forming through-silicon-vias or through-substrate-vias according to an embodiment of the present invention.

Figure 2:
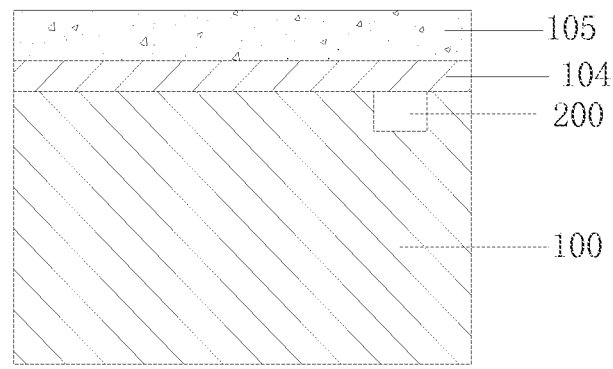
FIGS. 2-7 illustrate a method for forming through silicon vias according to an embodiment of the present invention.

In FIG. 2, a dielectric layer 104 is deposited on over substrate 100. Then, an etch stop layer 105 is deposited over dielectric layer 104. Dielectric layer 104 may be formed by a dielectric material layer selected from phosphosilicate glass (PSG), borophosphosilicate glass (BPSG), fluorinated silicate glass (FSG), SiOxCy, spin-on glass, spin-coated polymer, silicon carbide, or any one or more materials having a variety of acceptable dielectric properties. Dielectric layer 104 may be deposited using conventional methods, such as spin coating, chemical vapor deposition (CVD), plasma enhanced chemical vapor deposition (PECVD), etc. In some embodiments, etch stop layer 105 can include silicon nitride formed by a CVD process. In some embodiments, etch stop layer 105 can be formed on substrate 100 without an underlying dielectric layer.

Figure 3:
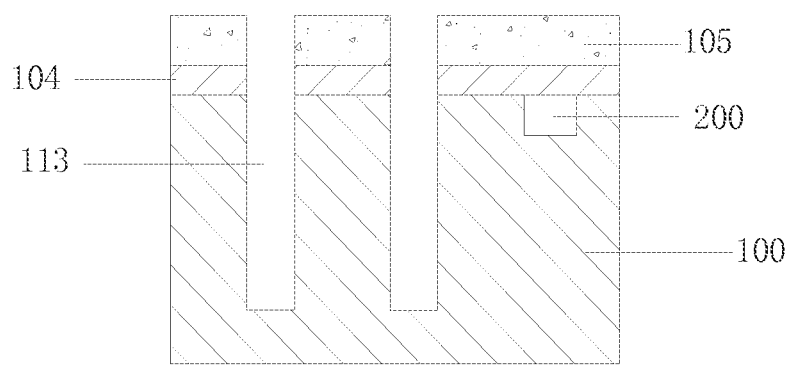

In FIG. 3, an annular groove 113 is etched through layers 104 and 105 and into substrate 100. The depth of annular groove 113 is selected according to the desired depth of the through silicon via. In some embodiments, the depth of the groove is deeper than the depth of device structure 200. In embodiments in which device structure 200 includes source/drain regions, the depth of the groove is deeper than the source/drain diffusion regions, so that the source/drain regions are not affected by subsequent process steps. The shape of the annular groove can be selected according to the desired shape of the via, for example, circular, elliptical, square, rectangle, etc.

Figure 4:
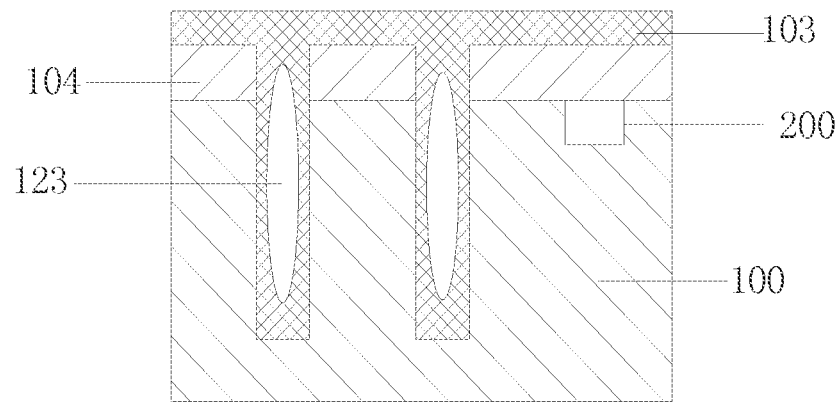

In FIG. 4, etch stop layer 105 is removed, and a dielectric layer 103 is deposited on the structure. In some embodiments, etch stop layer 105 is removed using a wet etching method, which can also prepare exposed surfaces of the substrate to form better and stable adhesion with dielectric layer 103. As shown in FIG. 4, dielectric layer 103 forms a sealed top portion in groove 113, but forms air gaps 123 in the groove.

In the deposition process of the insulating layer 103, a portion of the dielectric material is deposited on the surface of the substrate, and a portion of the dielectric material is deposited in the annular groove 113 forming a sealed portions. The sealed portions of the annular groove 113 are closed at both ends forming air gap 123. In embodiments of the invention, the process condition is controlled such that the aspect ratio, i.e., depth vs. width, of the annular groove 113 is between 5:1 and 20:1, and the direction of the plasma sputtering is such that the angle α between the plasma and the normal to the surface the annular groove is in a range of $0°<\alpha<45°$ or $70°<\alpha<90°$. These conditions reduce the deposition inside the annular groove 113 of dielectric material volume, while reducing the yield of plasma sputtering of opening of the annular groove 113, to speed up the rate of formation of overhang portions at the opening portion of the seal, increasing the volume of the air gap 123. In conventional methods, the plasma sputtering angle is often in the range of formed 45°~70°, resulting in the groove be substantially filled with the dielectric. In some embodiments, the total capacitance of the vias represents a reduction of about 10 to 60% from the capacitance of a conventional via structure. Since the dielectric constant of air is smaller than the dielectric constant of conventional dielectric materials, e.g., TEOS, etc., the via with an air gap 123 can have a smaller capacitance than conventional TSV structures with insulating layer of dielectric material. The volume of the air gap in some embodiments of the invention represents about 50 to 90% of the volume of the groove. Therefore, the methods of the invention improve the performance of the semiconductor circuit device and can be better applied to the low capacitance semiconductor devices.

Figure 5:
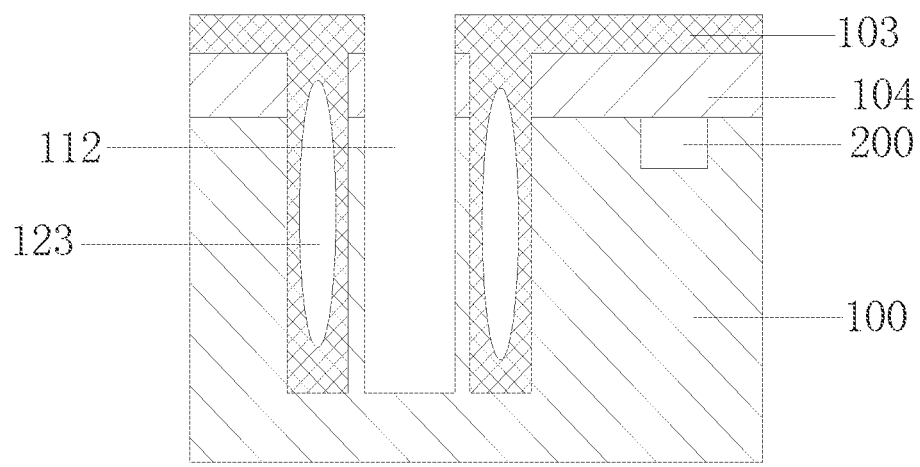

In FIG. 5, a via hole 112 is etched in the annular groove structure 113 of FIG. 4. As shown in FIG. 5, via hole 112 is surrounded by annular groove 113. Depending on the embodiments, via hole 112 may be in direct contact the annular groove or to be spaced from the substrate by a portion of the substrate material. The position of the via hole can be selected according to the electrical performance requirements. In some embodiments, the process of forming via hole 112 includes forming a photoresist layer on insulating layer 103, forming a mask pattern with exposure and development of the photoresist layer, and then using the photoresist layer as a mask to etch the insulating layer 103 and the substrate 100 to form via hole 112. In some embodiments, the via hole extends from a first surface of the substrate to an opposite second surface, if an additional substrate is to be attached to the substrate at the second surface. In embodiments that have no additional substrate, the via hole extends to a depth below existing devices 200 in the substrate in the front-end process, and at a suitable distance from the second surface. As shown in FIG. 5, via hole 112 has only one opening, with a sufficient depth that protect existing source/drain regions from subsequent process steps.

Figure 6:
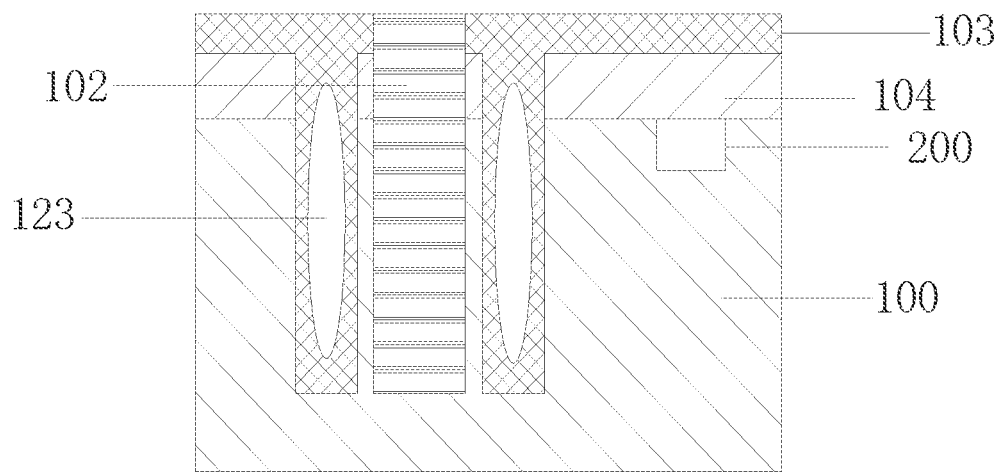
Figure 14:
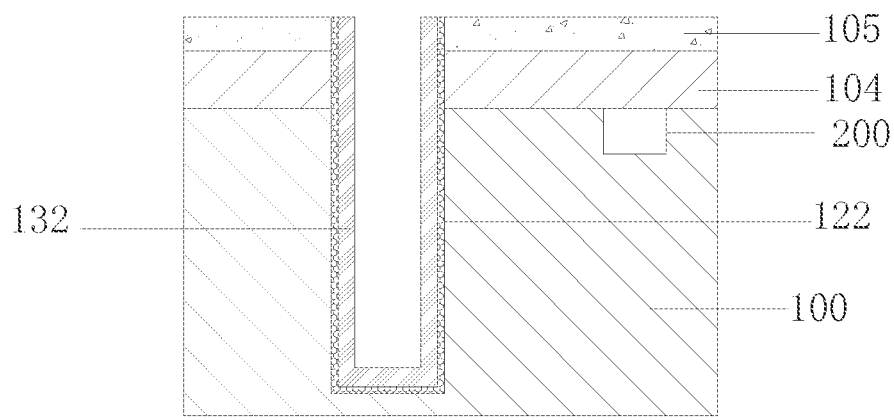
Figure 15:
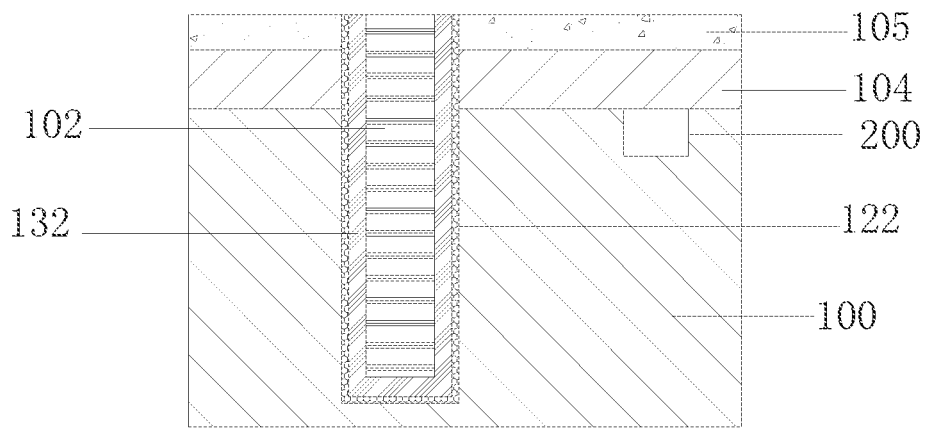

FIG. 6, a conductive material is deposited in via hole 112 to form through-silicon-via 102. The conductive material can be a metal, a metal compound such as metal silicide, or a doped semiconductor material, etc. that can provide desired conductivity for the interconnect structure. In some embodiments, to prevent the diffusion of the conductive material into the substrate, a diffusion barrier layer can be formed before the deposition of the conductive material. An example of diffusion barrier layer 132 is illustrated in FIGS. 14 and 15. The diffusion barrier can be deposited using a CVD, PVD, or plasma enhanced deposition process. The material for the diffusion barrier can include one or more of tantalum nitride, tantalum oxide, titanium oxide, silicon oxide, and silicon nitride, etc. When the conductive material filling the via hole is a conductive metallic material, a seed layer can be formed on the diffusion barrier layer.

Figure 7:
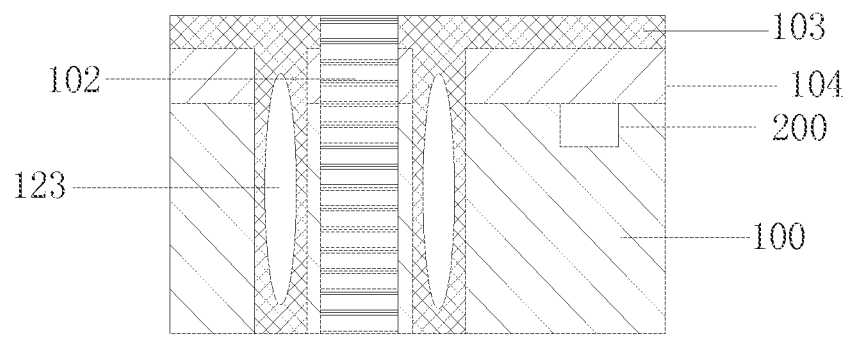

In FIG. 7, substrate 100 is thinned from the back side to expose through silicon via 102. In this configuration, substrate 100 can be used for connection in a 3-D device structure. The thinning can be carried out using a polishing process (e. g., chemical mechanical polishing), a grinding process, or an etching process.

FIGS. 8-12 illustrate methods for forming through silicon vias according to another embodiment of the present invention.

Figure 8:
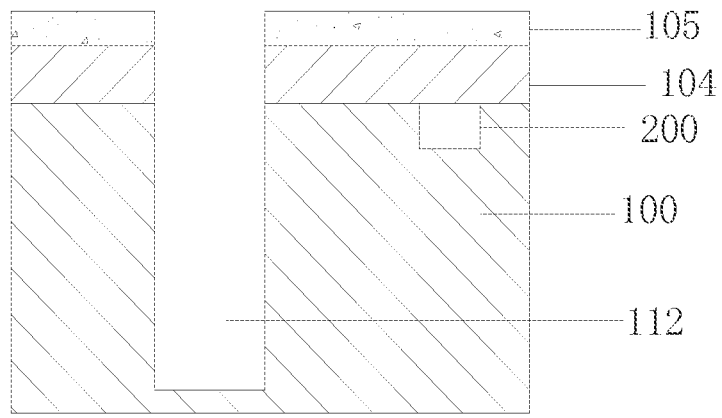
FIGS. 8-12 illustrate methods for forming through silicon vias according to another embodiment of the present invention.

In FIG. 8, a via hole 112 is etched in substrate 100. As described above in connection with FIGS. 1-3, substrate 100 can include device structures 200 already formed. Next, dielectric layer 104 and etch stop layer 105 are formed before the formation of via hole 112. As described above in connection with FIGS. 1-7, the via hole can extend to a lower portion of the substrate or through the substrate to the back surface.

Figure 9:
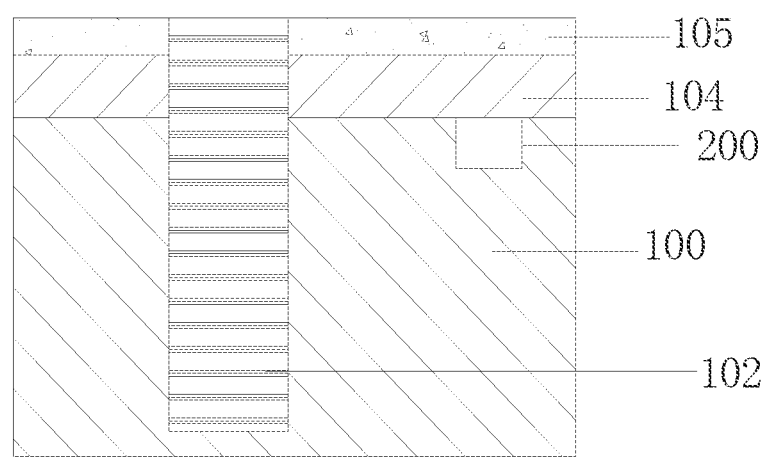

In FIG. 9, a conductive material, similar to the conductive material describe above in connection with FIG. 6, is deposited in via hole 112 to form through silicon via 102. As described above, a diffusion barrier layer can be formed before the deposition of the conductive material. In some embodiments, a seed layer can be formed on the diffusion barrier layer.

Figure 10:
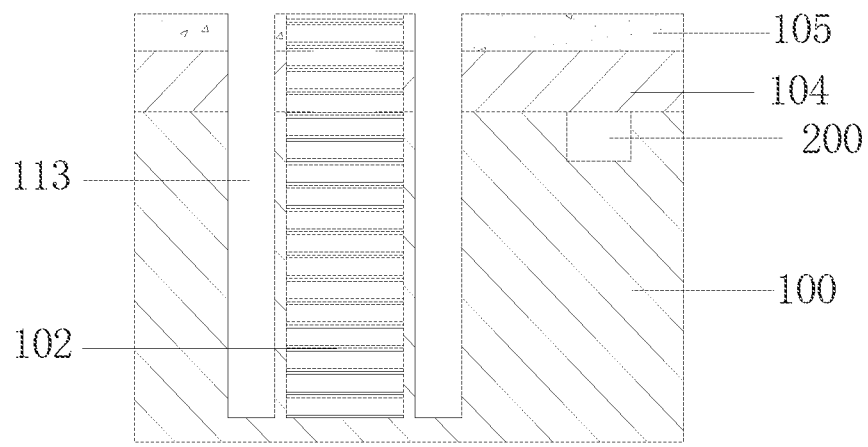

In FIG. 10, an annular shaped trench, or groove, 113 is formed surrounding via structure 102. In some embodiments, annular trench can be in contact with via structure 102. In other embodiments, a portion of the substrate of a suitable thickness can be present between annular trench 113 and via structure 102. The depth of the annular trench 113 can be similar to the depth of via structure 102.

Figure 11:
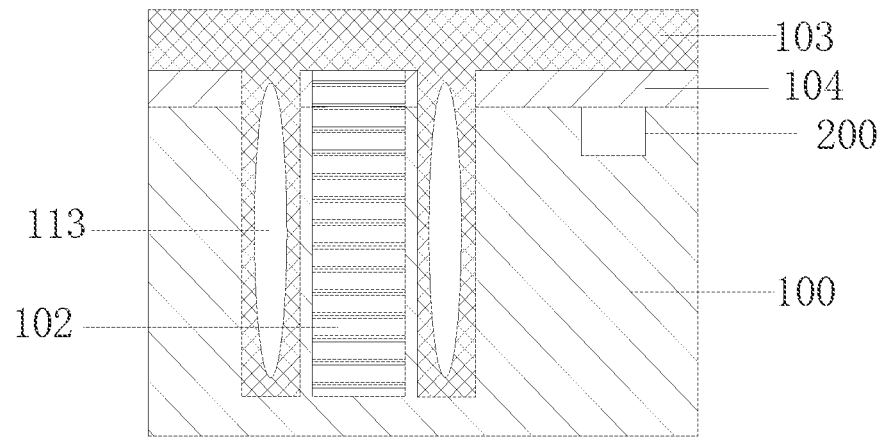

In FIG. 11, etch stop layer 105 is removed with wet etch. Next, dielectric layer 103 is deposited into trench 113 and over dielectric layer 104. As shown in FIG. 11, dielectric layer 103 forms a sealed top portion in groove 113, but forms air gaps 123 in the groove, similar to the process described above in connection with FIG. 4.

Figure 12:
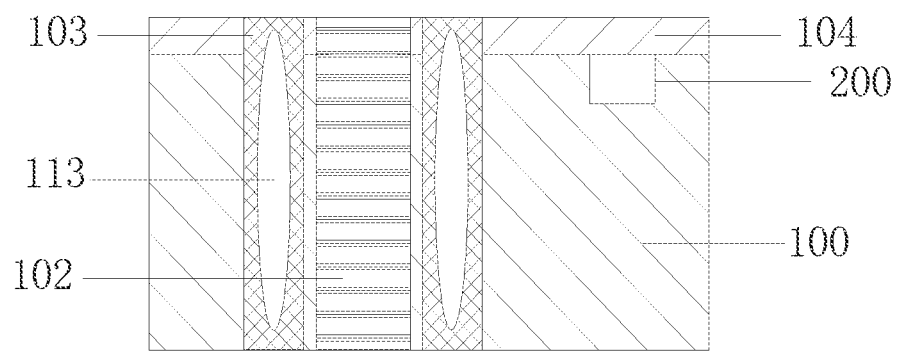

In FIG. 12, substrate 100 is thinned from the back side to expose through silicon via 102. In this configuration, substrate 100 can be used for connection in a 3-D device structure. The thinning can be carried out using a polishing process, a grinding process, or an etching process, similar to the process described above in connection with FIG. 6.

FIGS. 13-18 illustrate methods for forming through silicon vias according to yet another embodiment of the present invention.

Figure 13:
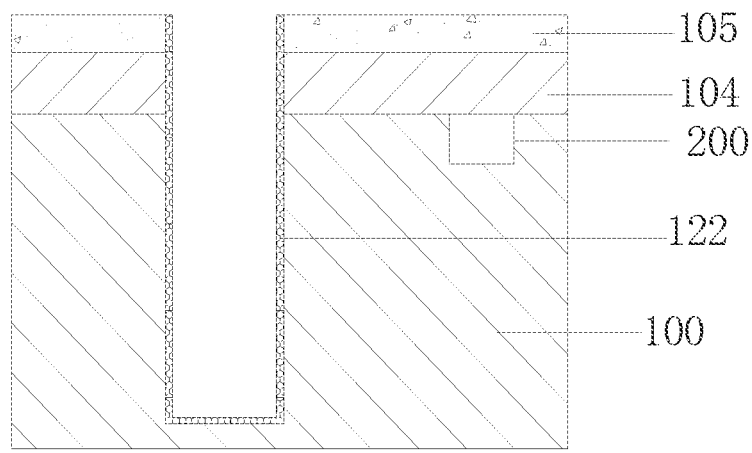
FIGS. 13-18 illustrate methods for forming through silicon vias according to yet another embodiment of the present invention.

FIG. 13 shows that a dielectric layer 122 is formed over the structure as shown in FIG. 8, in which a via hole is etched in a substrate 100 covered with a dielectric layer 104 and an etch stop layer 105. Dielectric layer 122 can provide better isolation between the substrate and an air gap that will be subsequently formed. The material forming the dielectric layer 122 can be selected from oxides, nitrides, oxides and nitrides, mixtures of organic substances, and mixtures of any of organic matters.

In FIG. 14, a diffusion barrier layer 132 is formed is formed over dielectric layer 122. In some embodiments, one or more diffusion barrier layers can be formed. The diffusion barrier layer can be a barrier to diffusion of the conductive material to substrate 100. The diffusion barrier layer is also useful in high performance interconnect structures involving through silicon via. The thickness of the diffusion barrier layer is preferably less than half of the width of the via hole. The one or more diffusion barrier layers can be made of tantalum nitride, tantalum oxide, titanium oxide, silicon oxide, or silicon nitride, or a combination of one or more of these materials.

In FIG. 15, a conductive material, similar to the conductive material describe above in connection with FIG. 6, is deposited in the via hole to form via 102. In some embodiments, a seed layer can be formed before the conductive material is deposited.

Figure 16:
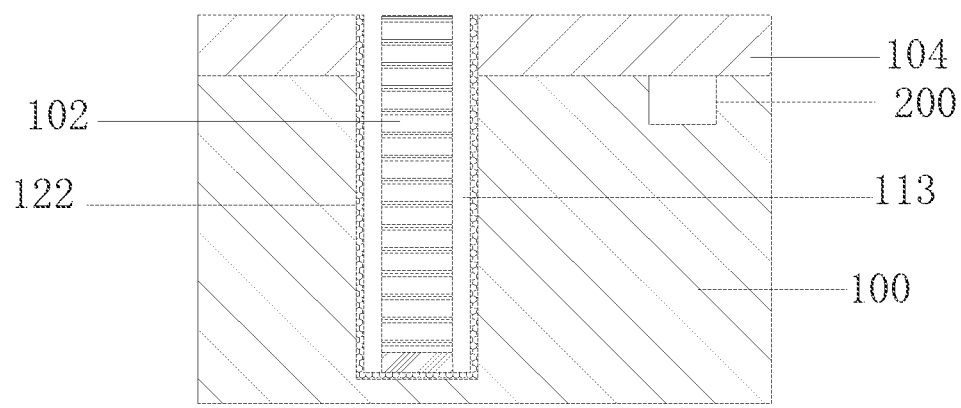

In FIG. 16, with etch stop layer 105 protecting the substrate, the diffusion barrier layer 132 is removed to form an annular trench 113 surrounding the conductive material in via 102. A suitable etch process can be used to remove diffusion barrier layer 132. Next, etch stop layer 105 is removed, which can be carried out, e.g., by using a selective etching process that removes etch stop layer 105 but preserve the conductive material in the via.

Figure 17:
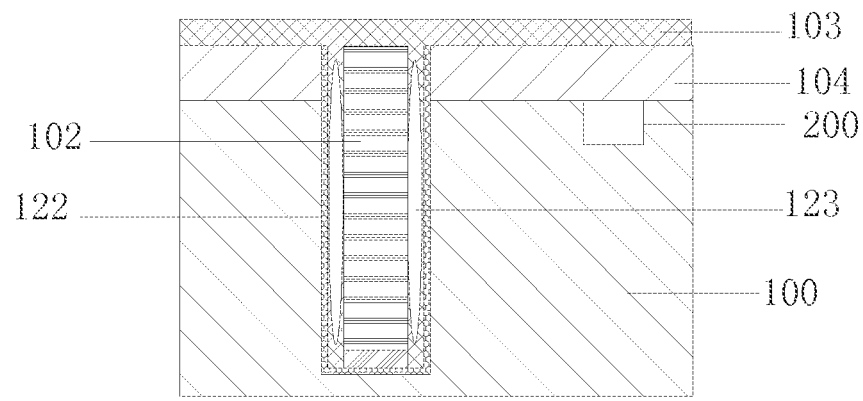

In FIG. 17, a dielectric layer 103 is form over substrate 100 and into annular trench 113. FIG. 17 shows a schematic cross-sectional structure of the substrate after the dielectric material filling, which seals the ends of the annular groove portion and forms an air gap 123.

Figure 18:
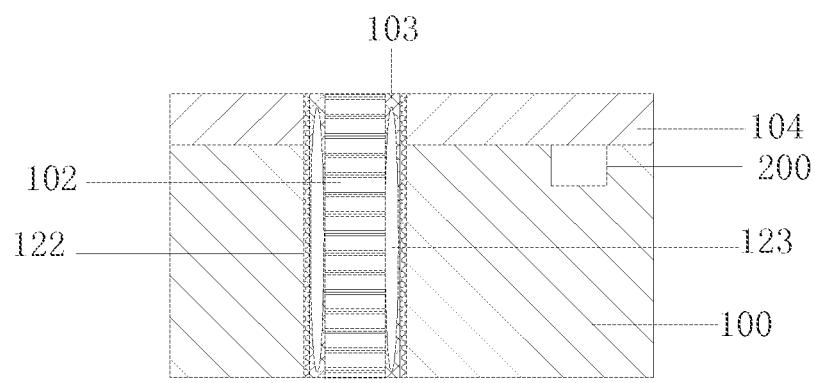

In FIG. 18, the substrate is thinned to expose the bottom portion of the via, similar to the structures described above.

Various methods for forming through-silicon-vias according to different embodiments of the invention are described above, with via structures shown in FIGS. 7, 12, and 18. The through-silicon-via interconnect structure includes a substrate 100, a through hole 102 extending through substrate 100, an annular groove 113 provided around the through-silicon-via. A sealed region 123 insulates via 102 from substrate 100. The sealed portion includes an air gap in in annular trench surrounding via 102. In some embodiments, the volume of the air gap is about 50% to 90% of the total volume of the annular groove 113.

Depending on the embodiment, through-silicon-via 102 can be separated from the annular trench 113 with a portion of the substrate, as shown in FIGS. 7 and 12. Through-silicon-via 102 can also be separated from the annular trench 113 with an etch barrier or diffusion barrier. Through-silicon-via 102 can also be in contact with the annular trench 113, as shown in FIG. 18.

As described above, embodiments of the present invention present various methods for forming through-silicon-via interconnect structures. These methods use standard semiconductor processes, do not require special equipment, and are flexible and easy to control. By controlling the aspect ratio of the annular trench and the angle between the plasma ions and the substrate, the methods can reduce sputtering that reduce overhangs at the entrance of the trench. Therefore, the deposition in the interior of the trench is reduced, and more deposition takes place at the entrance of the trench. As a result, the sealing of the trench entrance is accelerated, and a large volume of air gap can be formed inside the trench. Such large air gap can reduce the capacitance in the vias, making them suitable for low capacitance semiconductor devices.

It is also understood that the examples and embodiments described herein are for illustrative purposes only and that various modifications or changes in light thereof will be suggested to persons skilled in the art and are to be included within the spirit and purview of this invention.

What is claimed is:

1. A method for forming a through-substrate-via structure, the method comprising:
providing a substrate having a first surface and a second surface opposite the first surface;
forming an etch stop layer on the first surface of the substrate;
etching through the etch stop layer into the substrate to form a via hole in the substrate;
depositing a conductive material in the via hole to form a via;
forming an annular groove in the substrate surrounding the conductive material in the via hole;
etching the annular groove such that the annular groove exposes at least a portion of the conductive material;
depositing a dielectric material in the annular groove with overhang portions of the deposited dielectric material at a top surface of the groove forming an air gap in an interior portion of the groove; and
thinning the second surface of the substrate exposing a portion of the via while keeping a portion of the dielectric material at a bottom of the air gap for sealing the air gap.

2. The method of claim 1, further comprising:
before depositing the conductive material, forming a dielectric liner layer lining the via hole, and forming a diffusion barrier layer over the dielectric liner layer in the via hole.

3. The method of claim 2, wherein forming the annular groove comprises removing the diffusion barrier layer to form the annular groove.

4. The method of claim 3, further comprising:
removing the etch stop layer; and
forming a second dielectric layer on the dielectric liner layer.

5. The method of claim 1, wherein depositing a dielectric material in the annular groove comprises using a plasma enhanced chemical vapor deposition process wherein the substrate is oriented at angle with respect to the plasma sputtering direction to reduce plasma sputtering yield.

6. The method of claim 5, wherein an angle $\alpha$ is formed between the plasma sputtering direction and a normal direction of the top surface of the groove and the angle is in the following range, $0°<\alpha<20°$ or $45°<\alpha<90°$.

7. The method of claim 5, wherein an angle $\alpha$ is formed between the plasma sputtering direction and a normal direction of the top surface of the groove and the angle is in the following range, $0°<\alpha<10°$ or $50°<\alpha<90°$.

8. The method of claim 1, wherein a volume of the air gap is about 50%~90% of a volume of the annular groove.

9. The method of claim 1, wherein the annular groove is characterized by a width to depth ratio of about 5:1~20:1.

10. A method for forming a through-silicon-via (TSV) structure, the method comprising:
providing a substrate having a first surface and a second surface opposite the first surface;
forming an etch stop layer on the first surface of the substrate;

etching through the etch stop layer into the substrate to form an annular groove in the substrate;

removing the etch stop layer;

after removing the etch stop layer, depositing a dielectric material in the annular groove with overhang portions of the deposited dielectric material at a top surface of the groove to form an air gap in an interior portion of the groove, wherein depositing a dielectric material in the annular groove comprises using a plasma enhanced chemical vapor deposition process wherein the substrate is oriented at angle with respect to the plasma sputtering direction to reduce plasma sputtering yield;

forming a via hole inside the annular groove in the substrate;

depositing a conductive material inside the via hole to form a via; and thinning the second surface of the substrate exposing a portion of the via while keeping a portion of the dielectric material at a bottom of the air gap for sealing the air gap, wherein a volume of the air gap is about 50%~90% of a volume of the annular groove to reduce a capacitance value of the via.

11. The method of claim 10, wherein an angle α is formed between the plasma sputtering direction and a normal direction of the top surface of the groove and the angle is in the following range, $0°<α<20°$ or $45°<α<90°$.

12. The method of claim 10, wherein an angle α is formed between the plasma sputtering direction and a normal direction of the top surface of the groove and the angle is in the following range, $0°<α<10°$ or $50°<α<90°$.

13. The method of claim 10, wherein the capacitance value of the via is about 10 to 60% of a capacitance value of a via without the air gap in the interior portion of the groove.

14. The method of claim 10, wherein the annular groove is characterized by a width to depth ratio of about 5:1~20:1.

15. A method for forming a through-substrate-via structure, the method comprising:

forming a via hole in a substrate;

forming a dielectric liner layer lining the via hole;

forming a diffusion barrier layer on the dielectric liner layer in the via hole;

depositing a conductive material on the diffusion barrier layer in the via hole;

removing the diffusion barrier layer to form an annular groove while retaining a portion of the diffusion barrier layer below the conductive material; and depositing a dielectric material in the annular groove with overhang portions of the deposited dielectric material at a top surface of the annular groove forming an air gap in an interior portion of the annular groove.

16. The method of claim 15, wherein depositing the dielectric material in the annular groove comprises using a plasma enhanced chemical vapor deposition process wherein the substrate is oriented at angle with respect to the plasma sputtering direction to reduce plasma sputtering yield.

17. The method of claim 16, wherein an angle α is formed between the plasma sputtering direction and a normal direction of the top surface of the groove and the angle is in the following range, $0°<α<20°$ or $45°<α<90°$.

18. The method of claim 15, further comprising thinning the substrate to expose a bottom portion of the conductive material.

19. The method of claim 15, further comprising-thinning the substrate from its backside to remove the portion of the diffusion barrier layer below the conductive material.

20. The method of claim 19, further comprising planarizing the dielectric layer.

* * * * *